United States Patent
Kohata

(10) Patent No.: US 9,685,581 B2
(45) Date of Patent: Jun. 20, 2017

(54) MANUFACTURING METHOD OF SOLAR CELL

(71) Applicant: MITSUBISHI ELECTRIC CORPORATION, Chiyoda-ku, Tokyo (JP)

(72) Inventor: Hayato Kohata, Chiyoda-ku, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 14/785,575

(22) PCT Filed: Apr. 24, 2013

(86) PCT No.: PCT/JP2013/062081
§ 371 (c)(1),
(2) Date: Oct. 19, 2015

(87) PCT Pub. No.: WO2014/174613
PCT Pub. Date: Oct. 30, 2014

(65) Prior Publication Data
US 2016/0072003 A1 Mar. 10, 2016

(51) Int. Cl.
*H01L 31/18* (2006.01)
*H01L 31/0236* (2006.01)
*H01L 31/068* (2012.01)

(52) U.S. Cl.
CPC .... *H01L 31/1864* (2013.01); *H01L 31/02363* (2013.01); *H01L 31/068* (2013.01);
(Continued)

(58) Field of Classification Search
CPC .................................................. H01L 31/0684
See application file for complete search history.

(56) References Cited

U.S. PATENT DOCUMENTS

| 8,257,994 B2* | 9/2012 | Funakoshi | ........ H01L 31/02363 438/57 |
|---|---|---|---|
| 2010/0190286 A1* | 7/2010 | Kohira | .................... H01L 31/18 438/57 |
| 2011/0298100 A1* | 12/2011 | Nakamura | .......... H01L 31/0288 257/655 |

FOREIGN PATENT DOCUMENTS

| CN | 102246275 A | 11/2011 |
| CN | 102881767 A | 1/2013 |

(Continued)

OTHER PUBLICATIONS

Office Action issued on Jun. 7, 2016, by the Chinese Patent Office in corresponding Chinese Patent Application No. 201380075627.7 and partial English translation of the Office Action. (13 pages).

(Continued)

*Primary Examiner* — Yu-Hsi D Sun
(74) *Attorney, Agent, or Firm* — Buchanan Ingersoll & Rooney PC

(57) ABSTRACT

A manufacturing method of a solar cell having diffusion layers of different conductivity types on a front surface of a semiconductor substrate and a back surface thereof, respectively, includes a step of forming a diffusion protection mask containing impurities to cover at least a partial region of the semiconductor substrate, and a diffusion step of performing a diffusion step including a thermal step in a state where at least the partial region of the semiconductor substrate is covered with the diffusion protection mask containing impurities, forming a first-impurity diffusion layer in a first region covered with the diffusion protection mask, and forming a second-impurity diffusion layer having a different impurity concentration or a different conductivity type from that of the diffusion protection mask in a second region exposed from the diffusion protection mask.

8 Claims, 12 Drawing Sheets

(52) U.S. Cl.
CPC ...... *H01L 31/1804* (2013.01); *H01L 31/1868* (2013.01); *Y02E 10/547* (2013.01); *Y02P 70/521* (2015.11)

(56) References Cited

FOREIGN PATENT DOCUMENTS

| | | |
|---|---|---|
| EP | 2 345 062 A1 | 7/2011 |
| JP | 64-45176 A | 2/1989 |
| JP | 2004-247364 A | 9/2004 |
| JP | 2012-507855 A | 3/2012 |
| JP | 2013-26578 A | 2/2013 |
| WO | WO 2010/050936 A1 | 5/2010 |
| WO | 2010090090 A1 | 8/2010 |
| WO | WO 2012/008061 | 1/2012 |

OTHER PUBLICATIONS

Japanese Office Action dated May 10, 2016 issued in corresponding Japanese Patent Appln. No. 2015-513414, with English translation (4 pages).

International Search Report (PCT/ISA/210) mailed on May 21, 2013, by the Japanese Patent Office as the International Searching Authority for International Application No. PCT/JP2013/062081.

Written Opinion (PCT/ISA/237) mailed on May 21, 2013, by the Japanese Patent Office as the International Searching Authority for International Application No. PCT/JP2013/062081.

Taiwanese Office Action dated Jul. 8, 2015, issued in corresponding Taiwanese Patent Application No. 102135279. (13 pages) (English language translation of Office Action only).

Knoblock, J. et al., "High-Efficiency Solar Cells From FZ, CZ and MC Silicon Material", IEEE 23$^{rd}$ PVSC, pp. 271-276, 1993.

Wolf, A. et al., "The SiNTO Process: Utilizing a SiNx Anti-Reflection Layer for Emitter Masking During Thermal Oxidation", Photovoltaic Specialists Conference (PVSC), 34$^{th}$ IEEE, pp. 534-539, 2009.

Japanese Office Action issued on Dec. 13, 2016, by the Japanese Patent Office in corresponding Japanese Patent Application No. 2015-513414 and partial English translation of the Office Action. (5 pages).

Chinese Office Action issued on Mar. 3, 2017, by the Chinese Patent Office in corresponding Chinese Patent Application No. 201380075627.7 and English translation of the Office Action. (12 pages).

* cited by examiner

MANUFACTURING METHOD OF SOLAR CELL

FIELD

The present invention relates to a manufacturing method of a solar cell, and more particularly to a back-surface passivation (PERC: Passivated Emitter and Rear Cell) type solar cell.

BACKGROUND

In a manufacturing process of a general silicon solar cell that constitutes a solar cell, a p-type silicon substrate is baked in a state where an $n^+$ emitter is formed on a light-receiving surface side of the substrate according to a thermal diffusion using $POCl_3$ and an Al paste is printed on a back surface of the substrate, thereby diffusing Al into the p-type silicon substrate to form a $p^+$ back surface field (BSF) and form an $n^+pp^+$ structure. This process is a simple process in which electrode formation and diffusion processing can be performed at the same time by using Al, not only as an electrode but also as a diffusion source at the same time. Because an effect of suppressing a recombination of the back surface is high and a conversion efficiency of about 19% can be attained in the case of a monocrystalline silicon, this process is commonly used.

However, there is room for improvement in a long-wavelength reflectance of the back surface. A conversion efficiency of more than 20% can be realized by using an oxide film or the like for passivation, or by forming a back-surface reflective film or the like to enhance the reflectance of the back surface of the cell.

According to Non Patent Literature 1, an output having a conversion efficiency of more than 20% is attained by forming a passivation film and a reflective film on the back surface. Patent Literature 1 also discloses a manufacturing process of a double-side light receiving solar cell.

CITATION LIST

Patent Literature

Patent Literature 1: International Publication No. WO2012/008061

Non Patent Literature

Non Patent Literature 1: IEEE 23th PVSC, J. Knobloch, et al, "High-efficiency solar cells from Fz, Cz and mc silicon material", 1993, pp. 271-276

SUMMARY

Technical Problem

However, although the back-surface passivation solar cell (hereinafter may be referred to just as "PERC type solar cell") described in Non Patent Literature 1 listed above is effective for improving the efficiency, there are problems in that the processes are complicated as compared to those in the conventional technique and that the cost is increased due to addition of a device for new processes. The processes of the PERC type solar cell according to Non Patent Literature 1 and the processes according to Patent Literature 1 are complicated. Specific processes to be added to the conventional manufacturing process of a solar cell are, for example, a process of forming a diffusion layer only on one surface, a diffusion process of forming a BSF in the case of an $n^+pp^+$ or $p^+nn^+$ structure or a front surface field (FSF) in the case of forming an emitter on a back surface, and a formation process of a passivation film on the back surface.

A first issue is to form a diffusion layer on each of the both surfaces. First, as a method of forming a diffusion layer only on one surface, a method of performing diffusion processing after a mask is formed on one surface, a method of etching one surface with a chemical or the like after forming a diffusion layer on the entire both surfaces, or a method of using ion implantation can be raised, for example. Further, in the case of forming diffusion layers having different conductivities on the respective surfaces, a process of forming a diffusion protection mask on one surface is also added when a second diffusion is applied.

A second issue is to form a passivation film on the back surface. For forming a passivation film of $p^+$ layer, SiN is inadequate and thus $SiO_2$ or $Al_2O_3$ needs to be used. However, thermal oxidization adversely forms a passivation film on the both surfaces, and when oxide films on the both surfaces are to be used respectively as passivation films for example, because the reflectance of the light-receiving surface is affected, the oxide films need to be made equal to or lower than about several tens of nanometers in thickness, which requires a process of additionally forming a film of SiN or the like also on the back surface. While a method of simultaneously forming a film of SiN on the both surfaces has been also studied as described in Patent Literature 1, an increase in the device cost as compared to conventional devices becomes a concern.

The present invention has been achieved in view of the above problems and an object of the present invention is to provide a PERC type solar cell that is easy to manufacture and highly efficient.

Solution to Problem

In order to solve the aforementioned problems, a manufacturing method of a solar cell having diffusion layers of different conductivity types respectively on a front surface of a semiconductor substrate and a back surface of the substrate according to one aspect of the present invention is constructed to include: a step of forming a diffusion protection mask containing impurities to cover at least a partial region of the semiconductor substrate; and a diffusion step of performing a diffusion step including a thermal step in a state where at least the partial region of the semiconductor substrate is covered with the diffusion protection mask containing impurities, forming a first-impurity diffusion layer in a first region covered with the diffusion protection mask, and forming a second-impurity diffusion layer having a different impurity concentration or a different conductivity type from that of the diffusion protection mask in a second region exposed from the diffusion protection mask.

Advantageous Effects of Invention

According to the present invention, a diffusion source is provided and a film containing impurities is formed on one surface as a diffusion protection mask of the next step. Thereafter, impurities different from those contained in the film formed on the one surface are diffused. In this manner, diffusion layers including different dopants are formed on a light-receiving surface side and a back surface side, respectively. Therefore, the diffusion layers are formed on both surfaces by one diffusion processing, thereby low cost and highly efficient solar cells can be manufactured.

BRIEF DESCRIPTION OF DRAWINGS

FIG. 3-1 is a cross-sectional process diagram illustrating a manufacturing process of the solar cell.

FIG. 3-2 is a cross-sectional process diagram illustrating a manufacturing process of the solar cell.

FIG. 3-3 is a cross-sectional process diagram illustrating a manufacturing process of the solar cell.

FIG. 3-4 is a cross-sectional process diagram illustrating a manufacturing process of the solar cell.

FIG. 3-5 is a cross-sectional process diagram illustrating a manufacturing process of the solar cell.

FIG. 3-6 is a cross-sectional process diagram illustrating a manufacturing process of the solar cell.

FIG. 3-7 is a cross-sectional process diagram illustrating a manufacturing process of the solar cell.

FIG. 3-8 is a cross-sectional process diagram illustrating a manufacturing process of the solar cell.

FIG. 4 is a diagram illustrating main parts of a step flow of a manufacturing method of a solar cell according to a second embodiment of the present invention.

FIG. 5 is a diagram illustrating a solar cell formed according to the step flow.

FIG. 6-1 is a cross-sectional process diagram illustrating a manufacturing process of the solar cell.

FIG. 6-2 is a cross-sectional process diagram illustrating a manufacturing process of the solar cell.

FIG. 6-3 is a cross-sectional process diagram illustrating a manufacturing process of the solar cell.

FIG. 6-4 is a cross-sectional process diagram illustrating a manufacturing process of the solar cell.

FIG. 6-5 is a cross-sectional process diagram illustrating a manufacturing process of the solar cell.

FIG. 6-6 is a cross-sectional process diagram illustrating a manufacturing process of the solar cell.

FIG. 6-7 is a cross-sectional process diagram illustrating a manufacturing process of the solar cell.

FIG. 6-8 is a cross-sectional process diagram illustrating a manufacturing process of the solar cell.

FIG. 6-9 is a cross-sectional process diagram illustrating a manufacturing process of the solar cell.

FIG. 7 is a diagram illustrating main parts of a step flow of a manufacturing method of a solar cell according to a third embodiment of the present invention.

FIG. 8-1 is a cross-sectional process diagram illustrating a manufacturing process of the solar cell.

FIG. 8-2 is a cross-sectional process diagram illustrating a manufacturing process of the solar cell.

FIG. 8-3 is a cross-sectional process diagram illustrating a manufacturing process of the solar cell.

FIG. 9 is a diagram illustrating a part of a step flow of a manufacturing method of a solar cell according to a fourth embodiment of the present invention.

FIG. 10-1 is a cross-sectional process diagram illustrating a manufacturing process of a solar cell according to the fourth embodiment of the present invention.

FIG. 10-2 is a cross-sectional process diagram illustrating a manufacturing process of the solar cell according to the fourth embodiment of the present invention.

FIG. 10-3 is a cross-sectional process diagram illustrating a manufacturing process of the solar cell according to the fourth embodiment of the present invention.

FIG. 10-4 is a cross-sectional process diagram illustrating a manufacturing process of the solar cell according to the fourth embodiment of the present invention.

FIG. 10-5 is a cross-sectional process diagram illustrating a manufacturing process of the solar cell according to the fourth embodiment of the present invention.

FIG. 10-6 is a cross-sectional process diagram illustrating a manufacturing process of the solar cell according to the fourth embodiment of the present invention.

FIG. 10-7 is a cross-sectional process diagram illustrating a manufacturing process of the solar cell according to the fourth embodiment of the present invention.

FIG. 10-8 is a cross-sectional process diagram illustrating a manufacturing process of the solar cell according to the fourth embodiment of the present invention.

DESCRIPTION OF EMBODIMENTS

Exemplary embodiments of a manufacturing method of a solar cell according to the present invention will be explained below in detail with reference to the accompanying drawings. Note that the present invention is not limited to the embodiments. Cross-sectional views of a solar cell used in the following embodiments are schematic, and a relation between the thickness and the width of layers, a ratio of the thickness among each of the layers, and the like may be different from those of actual products.

First Embodiment

Figure 1:
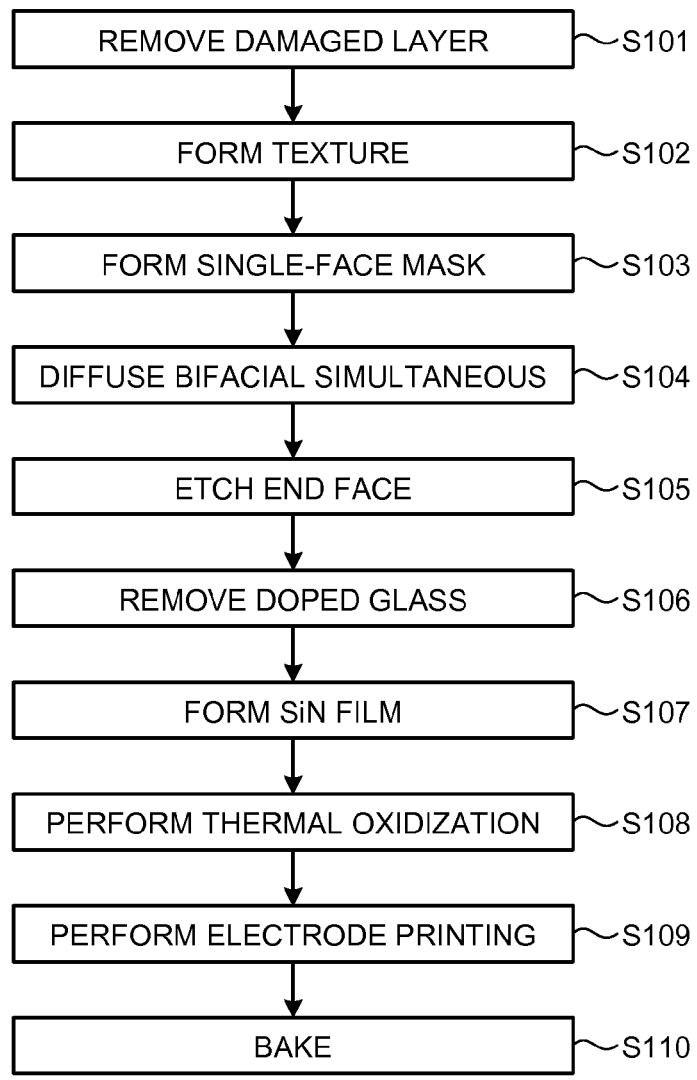
FIG. 1 is a diagram illustrating a step flow of a manufacturing method of a solar cell according to a first embodiment the present invention.
Figure 2:
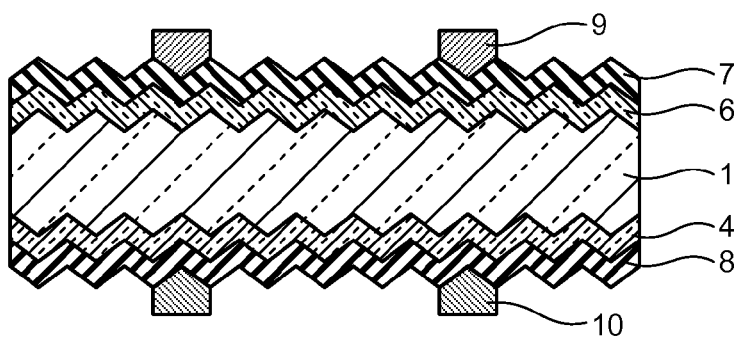
FIG. 2 is a diagram illustrating a solar cell formed according to the step flow.

FIG. 1 is a diagram illustrating a step flow of a manufacturing method of a solar cell according to a first embodiment of the present invention. FIG. 2 is a diagram illustrating a solar cell formed according to the step flow illustrated in FIG. 1. FIGS. 3-1 to 3-8 are cross-sectional process diagrams illustrating manufacturing process of the solar cell illustrated in FIG. 2. In the present embodiment, a manufacturing method of a high-efficiency cell in which manufacturing steps are simplified is proposed. First, a diffusion source is provided and a film containing impurities is formed on one surface as a diffusion protection mask of the next step. Thereafter, by diffusing impurities different from those contained in the film formed on the one surface, diffusion layers including different dopants are formed on a light-receiving surface side and a back surface side, respectively, so that the diffusion layers on both surfaces are formed by one diffusion processing. There are cases where efficiency improvement is achieved by flattening the back surface. However, a textured structure can be formed only on the light-receiving surface by forming the diffusion protection mask containing impurities before texture processing.

A formation process of a back-surface passivation film is also an additional process. However, an oxide film having a high passivation effect can be formed only on one surface by performing oxidization processing in a state in which an antireflection film such as SiN on the light-receiving surface is formed in advance. By forming a film having high long-wavelength reflectance such as Al or Ag is formed on the back surface in association with the structure as described above, further improvement in the efficiency can be provided.

Figures 1, 3:
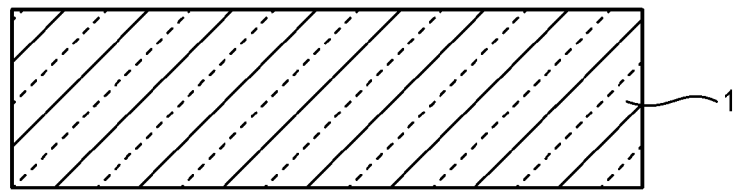
Figures 2, 3:
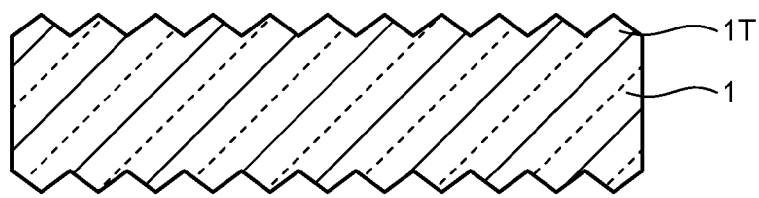
Figure 3:
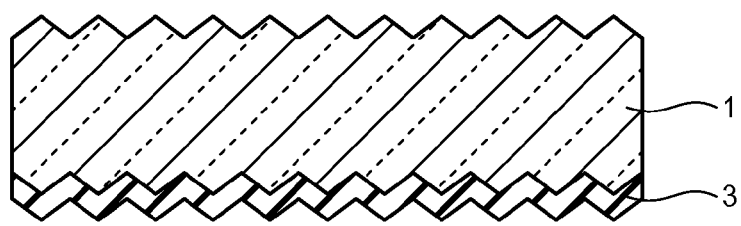

In the present embodiment, a case where a p-type monocrystalline silicon wafer 1 is used as a semiconductor substrate is described. To fabricate a solar cell, the p-type monocrystalline silicon wafer 1, for example, having a specific resistance of about 0.5 to 20 ohm/sq and a thickness of several hundreds of micrometers is first prepared as the semiconductor substrate (FIG. 3-1). Because the p-type monocrystalline silicon wafer 1 is manufactured by slicing an ingot obtained by cooling and solidifying melted silicon with a wire saw, damages caused at the time of slicing remain on the surface. Therefore, by dipping the p-type monocrystalline silicon wafer 1 in an acid or a heated alkaline solution such as a sodium hydroxide solution to perform etching the front surface, a damaged region having occurred at the time of cutout and located near the surface of the p-type monocrystalline silicon wafer 1 is removed. For example, the surface is removed only by 10 micrometers to 20 micrometers in the thickness with solution hydro oxide or sodium hydrogen carbonate of several to 20 wt % (damaged-layer removal step S101).

Subsequently, as illustrated in FIG. 3-2, the p-type monocrystalline silicon wafer 1 is dipped into, for example, an etchant formed by adding an additive including a polysaccharide by about 0.1 w % to a sodium hydroxide solution of about 1 w % to perform anisotropic etching and an uneven portion 1T is formed on both the front and back surfaces, thereby forming a textured structure (texture formation step S102). The textured structure is a method of, by forming an uneven portion on a surface, reducing the reflectance by means of multi-reflection. While the textured structure to be used in the present invention can be formed by any method, a structure having a high reflectance-reducing effect is desirable.

In the case of a p-type monocrystalline silicon wafer, anisotropic etching using an etching rate difference between crystal surface orientations is effective when a solution in which an additive agent has been added to NaOH or KOH is applied to a wafer with a surface of a crystal orientation (100). However, when polycrystalline silicon is used as a semiconductor substrate, the anisotropic etching is not effective because the crystal orientation in the wafer plane is not uniform, and isotropic etching using a fluonitric acid-based solution and removing only a damaged layer by utilizing a machined shape formed at the time of slicing is generally used.

As cell structures, a bifacial structure in which an electrode is formed in one part of the back surface to use incident light from the back side and a structure in which a back surface reflector (BSR) is formed on the entire back surface to increase reflection of long wavelengths that cannot be completely absorbed within the silicon are conceivable. In the former case, it is sometimes more advantageous to have a textured structure also on the back surface when incident light from the back surface is used. In the latter case, it is sometimes more preferable that the back surface be flat from the viewpoint of passivation. Therefore, it is alternatively possible to perform printing of a dopant paste (DP) containing impurities, which is described in the next process, before the texture forming process so as to be used as an etching protection mask, so that a cell in which only the back surface is flattened can be fabricated. This process is described later.

Next, as illustrated in FIG. 3-3, a diffusion protection mask film 3 is formed on one surface of the p-type monocrystalline silicon wafer 1 (one-surface mask formation step S103). Here, to the diffusion protection mask 3, impurities different from an impurity source at the time of diffusion are introduced in advance. For example, an oxide film containing P or an oxide film containing B is formed. In the present embodiment, a BSG film having a thickness of about 1 micrometer is formed by a printing method. A method of forming the diffusion protection mask can be any of a printing method, a spin coating method, a chemical vapor deposition (CVD) method, or a sputtering method. Further, in order to avoid scattering of the impurities from the mask, a mask such as an SG film containing no impurities can be formed in a stacked manner.

Figures 3, 4:
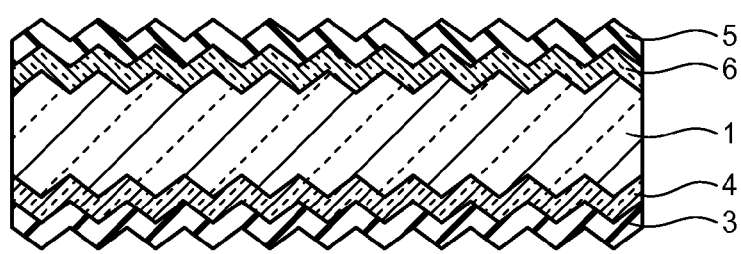

After formation of the diffusion protection mask 3, as illustrated in FIG. 3-4, diffusion layers are formed simultaneously on both surfaces of the p-type monocrystalline silicon wafer 1, respectively, by thermal diffusion processing (bifacial simultaneous diffusion step S104). An n-type diffusion layer 6 is formed by diffusing n-type impurities such as phosphorus on the front side as a light-receiving surface, and a p-type diffusion layer 4 is formed on the back surface side by diffusing p-type impurities such as boron from the diffusion protection mask including the BSG film. A diffusion source can be of an aqueous state, to which a method of bubbling is applied to cause a gas to flow, can be of a solid state, can be of a gaseous state, and can be the one, to which a method of spin coating is applied, or the like. Because diffusion optimal temperature may be different between the light-receiving surface and the back surface, by appropriately setting detailed processes at the time of the thermal diffusion, thermal treatment processes suitable to the respective surfaces can be provided. In this process, a doped glass 5 is formed on the surface of the light-receiving side. Although not illustrated in FIG. 3-4, a doped glass is also deposited on the diffusion protection mask 3 on the back surface side.

It is assumed, for example, that when a thermal diffusion using $POCl_3$ is to be performed to the light-receiving surface, a required diffusion temperature is about 900° C. for the back-surface diffusion layer and a required diffusion temperature for the light-receiving-surface diffusion layer is about 850° C. In this situation, the respectively optimal diffusion layers can be formed by first performing high-temperature processing and then performing low-temperature processing in which $POCl_3$ is caused to flow. Functions of the diffusion layers can be an emitter, a BSF, and an FSF. The diffusion protection mask does not need to be uniform in the entire region and, when a print paste is used, selective diffusion layers can be formed by printing paste of different impurity concentrations twice and patterning the pastes.

Subsequently, end portions are etched for junction isolation (end-face etching step S105). For example, there is a method of stacking wafers and performing plasma processing while causing a gas such as $CF_4$ to flow in a state where the upper surface side and the lower surface side are protected, and removing films on side surfaces by etching. There are other methods including a method of processing cell end portions with a laser after forming electrodes.

Figures 3, 4, 5:
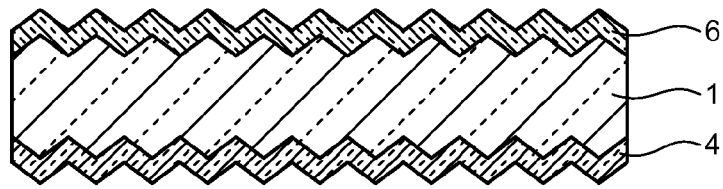

Next, as illustrated in FIG. 3-5, the doped glass 5 formed at the time of the diffusion is removed with a solution using a hydrofluoric acid (doped-glass removal step S106). Subsequently, an antireflection film on the light-receiving surface side and a passivation film on the back surface are formed. As the simplest process, for example, there is a method in which an oxide film is formed on the entire both surfaces by thermal oxidization processing so as to be used as the passivation film and the antireflection film. However, for example, SiN or $TiO_2$ is more effective as the antireflection effect. In the present embodiment, processes in a case where SiN is formed on the light-receiving surface and an oxide film is formed on the back surface are described.

First, as illustrated in FIG. 3-6, an antireflection film 7 such as SiN is formed on the light-receiving surface (SiN formation step S107). Thereafter, oxidization processing is performed in a state where SiN is formed only on the light-receiving surface, whereby a thermally-oxidized film 8 can be formed only on the back surface as illustrated in FIG. 3-7 (thermally-oxidized film formation step S108).

The oxidization processing can be either dry oxidization processing or wet oxidization processing. However, when the processing is performed in a lower temperature, an adverse influence that the impurities in the diffusion layers are re-diffused is smaller and thus control is easier. Although it can depend on impurity concentration of the diffusion layers, the wet oxidization can form an oxide film having a sufficient thickness of about 100 nanometers to provide a passivation effect even, for example, by oxidization processing at 800° C., and an SiN film is also expected to provide a sufficient effect as an oxidization protection film.

Finally, light-receiving surface electrodes 9 and back surface electrodes 10 are printed as illustrated in FIG. 3-8 (electrode printing step S109) and are baked (baking step S110), thereby forming the solar cell illustrated in FIG. 2. The front and back electrodes can be formed by printing a paste such as Ag on the light-receiving surface and the back surface and baking the paste. The electrodes are not limited to coated films using a paste, but can be alternatively formed using thin films.

The back surface electrode 10 can be formed on the entire back surface of the substrate. By forming a film for improving the reflectance or the conductivity of the back surface, improvement in its characteristic is expected. As a method of improving both the reflectance and the conductivity, Al or Ag is applied, for example.

In the solar cell configured as described above, when sunlight is applied from the light-receiving surface side of the solar cell to the p-type monocrystalline silicon wafer 1 as the semiconductor substrate, holes and electrons are generated. The generated electrons move toward the n-type diffusion layer 6 and the holes move toward the p-type monocrystalline silicon wafer 1 due to the electric field of a pn junction (a junction surface between the p-type monocrystalline silicon wafer 1 and the n-type diffusion layer 6). Accordingly, electrons in the n-type diffusion layer become excessive, holes in the p-type monocrystalline wafer 1 become excessive, and consequently photovoltaic power is generated. The photovoltaic power occurs in a direction of biasing the pn junction in the forward direction, which brings the light-receiving surface electrodes 9 connected to the n-type diffusion layer to negative electrodes and the back surface electrodes 10 connected to the high-concentration p-type diffusion layer 4 to positive electrodes, thereby causing a current to flow toward an external circuit (not illustrated).

In this manner, according to the present embodiment, the diffusion processes for the light-receiving surface side and the back surface side can be achieved in one process, which enhances the productivity and can provide a PERC type solar cell that is easy to manufacture and highly efficient.

Second Embodiment

Figures 3, 4, 5, 6:
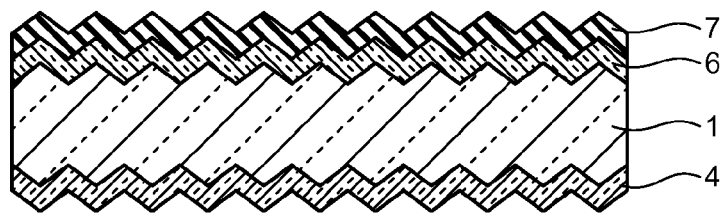

FIG. 4 is a diagram illustrating main parts of a step flow of a manufacturing method of a solar cell according to a second embodiment of the present invention. FIG. 5 is a diagram illustrating a solar cell formed according to the step flow illustrated in FIG. 4. FIGS. 6-1 to 6-9 are cross-sectional process diagrams illustrating main parts of manufacturing steps of the solar cell illustrated in FIG. 5. In the present embodiment, a manufacturing process in a case of using an n-type monocrystalline silicon wafer 1n as a semiconductor substrate is described. Processes up to a formation process of front and back diffusion layers are identical to those in the case of the p-type monocrystalline silicon wafer as long as donors and acceptors of impurities to be diffused are interchanged. Drawings up to FIG. 6-5 illustrate identical processes to those illustrated in the drawings up to FIG. 3-5 except that the conductivity types are opposite. Descriptions are started from FIG. 6-6. A p-type diffusion layer 6p is formed on the light-receiving surface side and an n-type diffusion layer 4n is formed on the back surface side.

When the n-type monocrystalline silicon wafer 1n is used, the emitter is a $p^+$ layer. However, SiN is high in the positive fixed charge density and has a low passivation effect for a $p^+$ layer. Accordingly, for example, a stack structure using an oxide film 7s as a passivation film and using SiN as an antireflection film is formed. When the stack structure is to be formed, the oxide film 7s having a thickness equal to or smaller than several tens of nanometers so as not to cause an adverse influence on the reflectance due to thermal oxidization is first formed as illustrated in FIG. 6-6 (thermal oxidization step S108a). At this time, a thin oxide film 8s is also formed on the back surface side.

Figures 3, 4, 5, 6, 7:
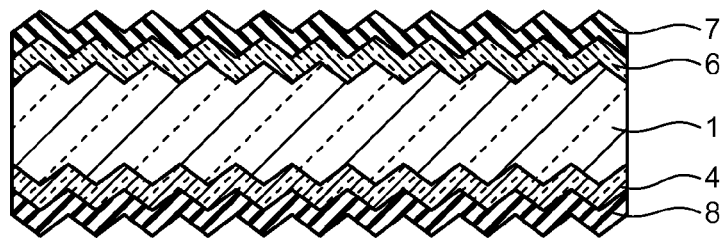

Subsequently, as illustrated in FIG. 6-7, the antireflection film 7 such as SiN is formed (SiN formation step S107).

Figures 3, 4, 5, 6, 7, 8:
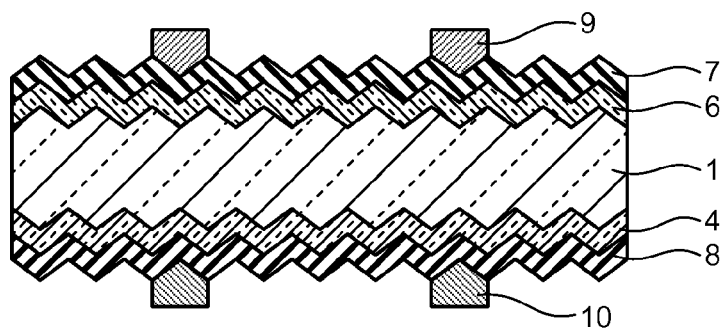
Figure 4:
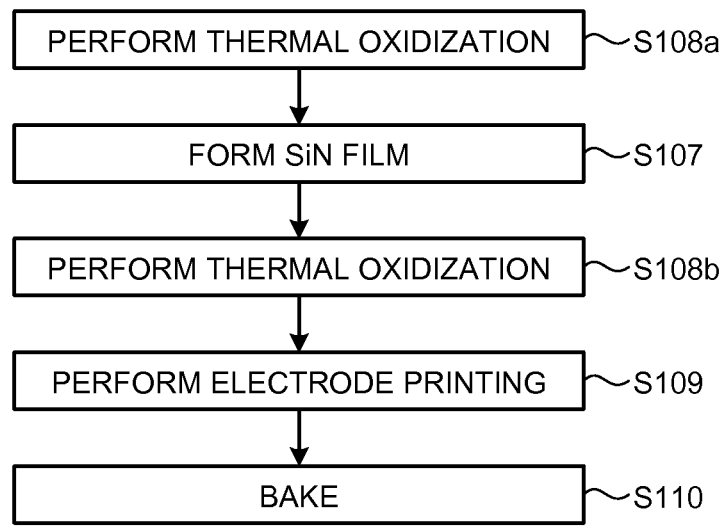
Figure 5:
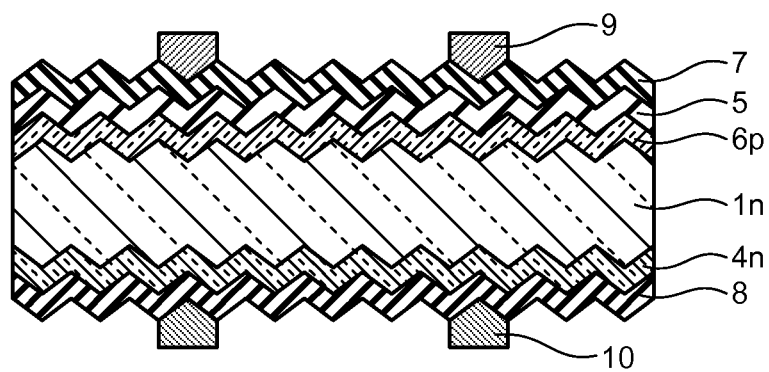

Next, as illustrated in FIG. 6-8, only the oxide film on the back surface side is increased by a method such as thermal oxidization processing (thermal oxidization step S108b), thereby forming a passivation film including the thermally-oxidized film 8 with a sufficient thickness also on the back surface.

Subsequently, as illustrated in FIG. 6-9, electrodes are printed (electrode printing step S109) and are baked (baking step S110) similarly to the first embodiment, whereby the solar cell illustrated in FIG. 5 is formed.

In this manner, according to the present embodiment, a PERC type solar cell that is easy to manufacture and highly efficient can be provided.

Third Embodiment

FIG. 7 is a diagram illustrating main parts of a step flow of a manufacturing method of a solar cell according to a third embodiment of the present invention. FIGS. 8-1 to 8-3 are cross-sectional process diagrams illustrating main parts of manufacturing steps of the solar cell illustrated in FIG. 7. In the present embodiment, a case in which the oxide-film formation processes are reduced to only once when the n-type monocrystalline silicon wafer 1n is used similarly to the second embodiment is described. Also in this case, the p-type diffusion layer 6p is formed on the light-receiving surface side and the n-type diffusion layer 4n is formed on the back surface side.

The oxidization rate depends on the impurity density of a diffusion layer. By appropriately selecting the impurity concentrations of the light-receiving surface and the back surface, films of suitable thicknesses can be simultaneously formed on the back surface and the light-receiving surface, respectively, by one oxidization processing in some cases. Further oxidization processing is not required when it is possible to form an oxide film of several tens of nanometers on the light-receiving surface and form an oxide film of about 100 nanometers on the back surface, and thus an identical solar cell to that in the second embodiment can be fabricated by the manufacturing steps as illustrated in FIGS. 7 and 8-1 to 8-3.

That is, while the processes up to that illustrated in FIG. 6-5 are identical to those in the second embodiment, oxide films of required minimum thickness are formed at the first thermal oxidization step without performing the second thermal oxidization step S108b for increasing the oxide film on the back surface in the present embodiment. When a stack structure is to be formed, the oxide film 7s having a thickness equal to or smaller than several tens of nanometers so as not to cause an adverse influence on the reflectance due to thermal oxidization and the thermally-oxidized film 8 on the back surface are first formed as illustrated in FIG. 8-1 (thermal oxidization step S108).

Subsequently, as illustrated in FIG. 8-2, the antireflection film 7 such as SiN is formed (SiN formation step S107).

Finally, as illustrated in FIG. 8-3, electrodes are printed (electrode printing step S109) and are baked (baking step S110) similarly to the second embodiment, whereby the solar cell illustrated in FIG. 5 is formed.

According to this method, a stack structure using as the passivation film, the oxide film 7s on the light-receiving surface side formed at the same time as the thermally-oxidized film 8 on the back surface, and using SiN as the antireflection film 7 is formed. A film having a sufficient passivation effect also for a p+ film can be thereby formed in one thermally oxidizing process.

Fourth Embodiment

Figures 1, 6:
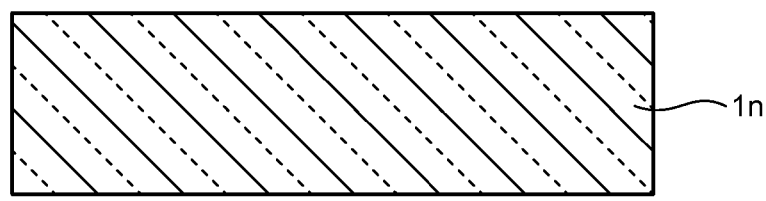
Figures 2, 6:
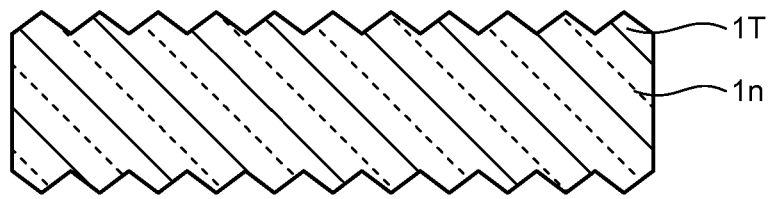
Figures 3, 6:
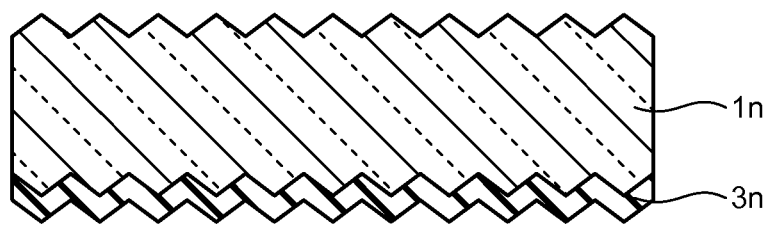
Figures 4, 6:
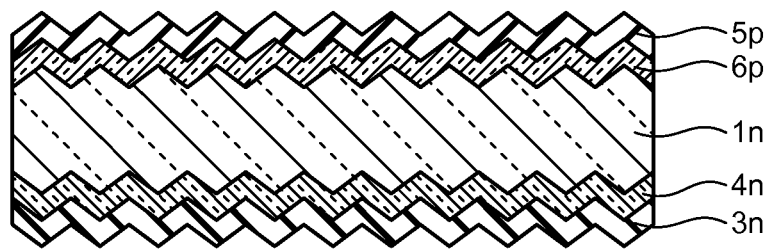
Figures 5, 6:
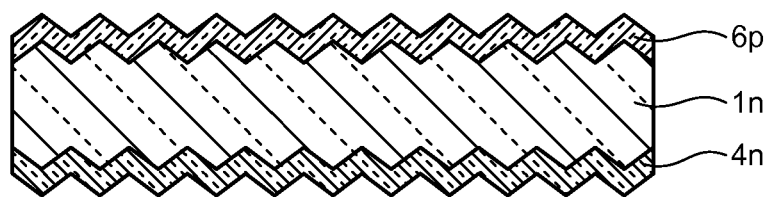
Figure 6:
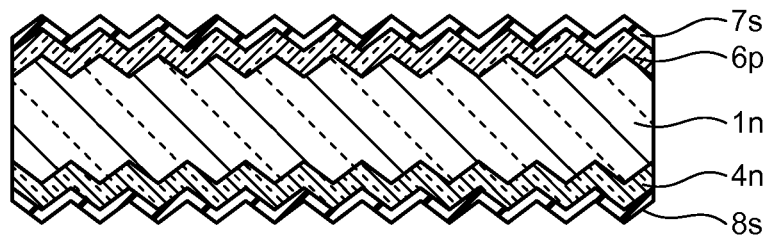
Figures 6, 7:
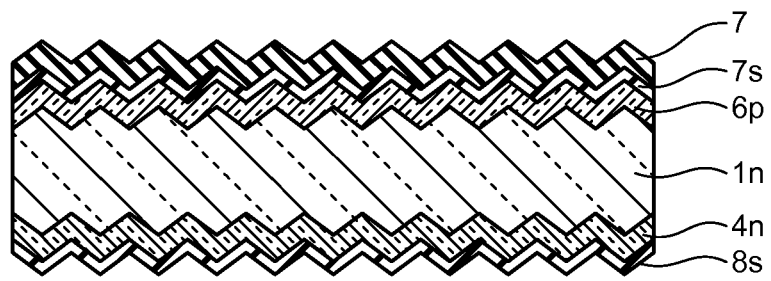
Figures 6, 7, 8:
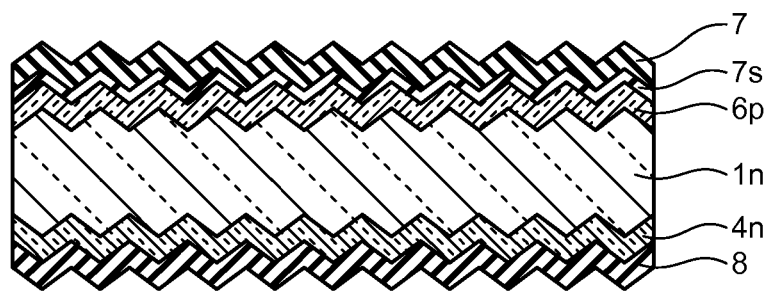
Figures 6, 7, 8, 9:
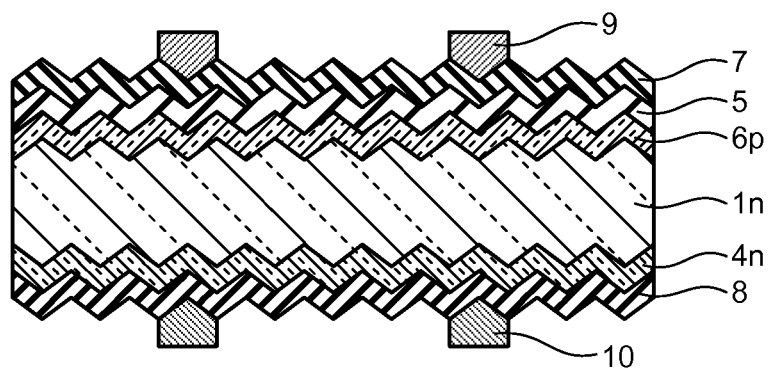
Figure 7:
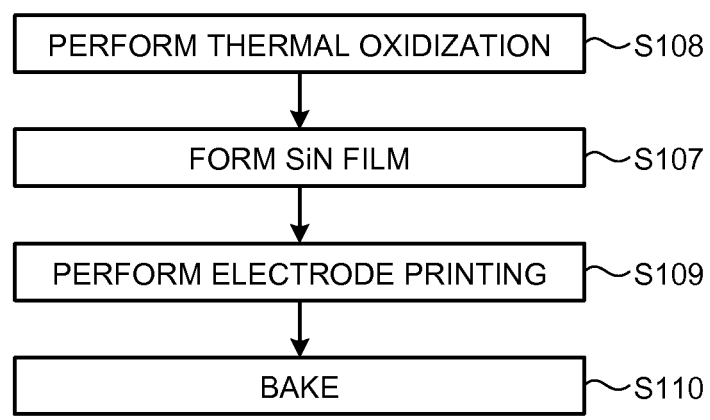
Figures 1, 8:
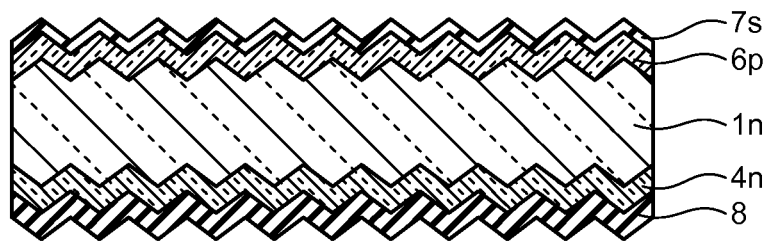
Figures 2, 8:
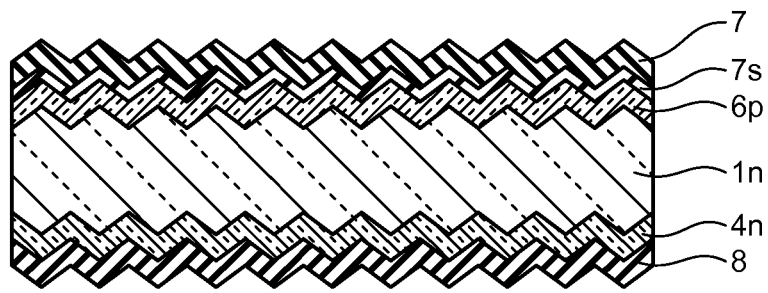
Figures 3, 8:
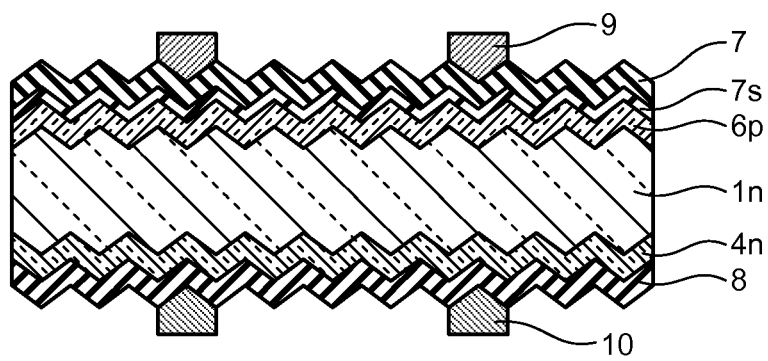
Figure 9:
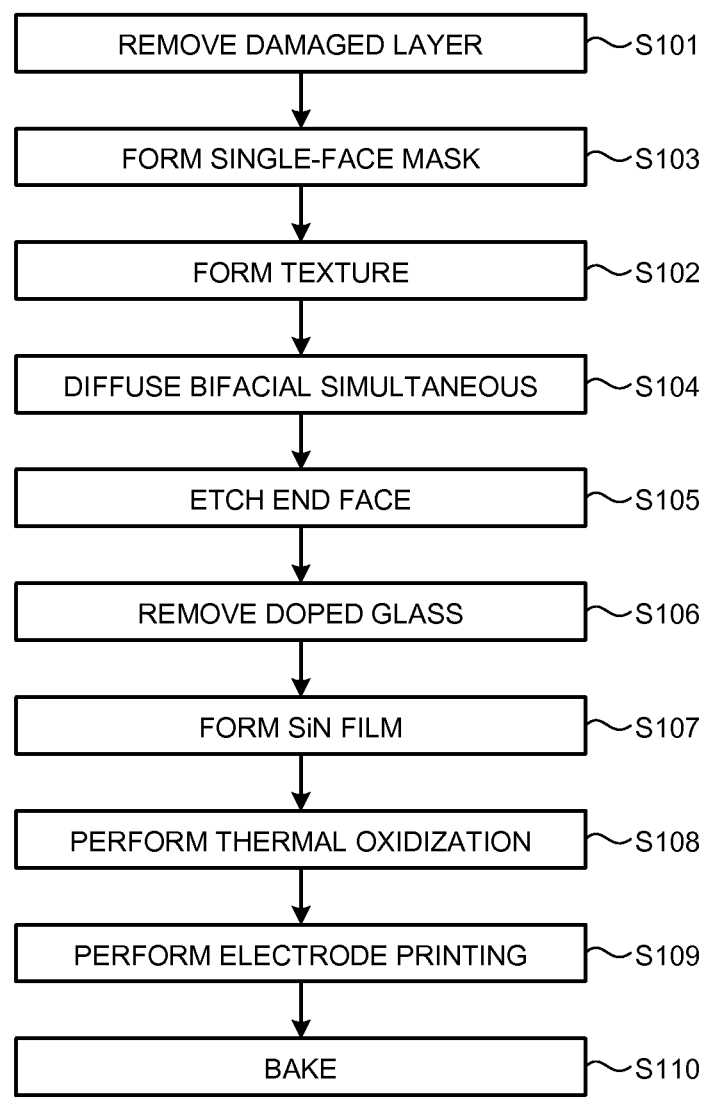
Figures 1, 10:
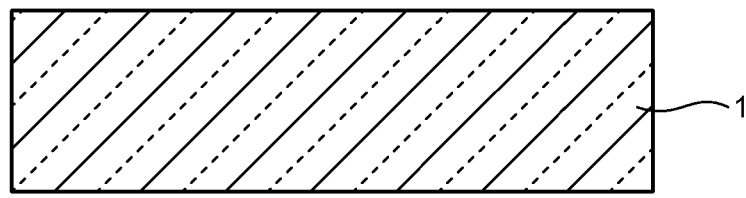
Figures 2, 10:
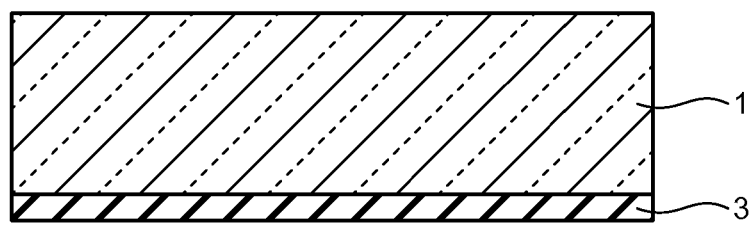
Figures 3, 10:
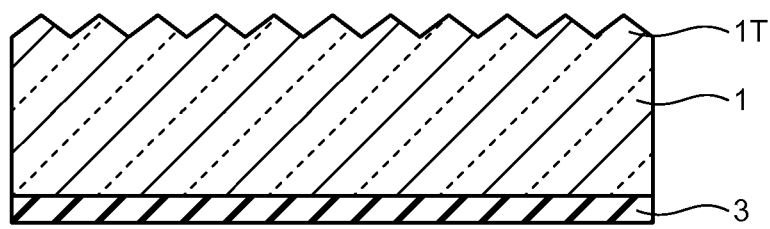
Figures 4, 10:
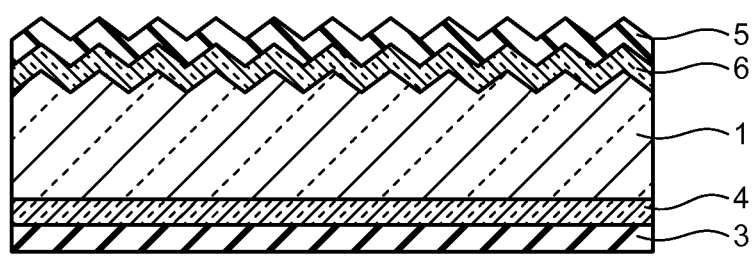
Figures 5, 10:
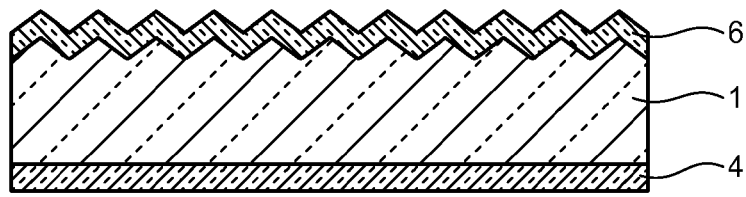
Figures 6, 10:
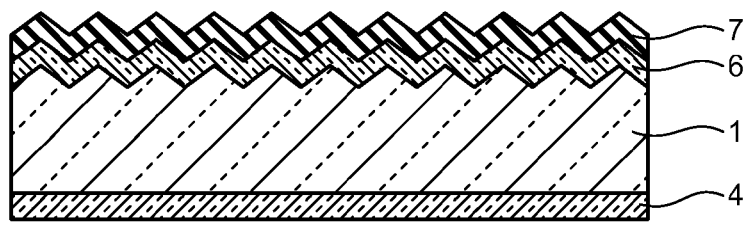
Figures 7, 10:
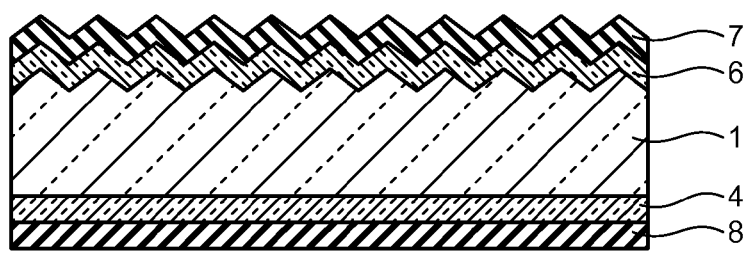
Figures 8, 10:
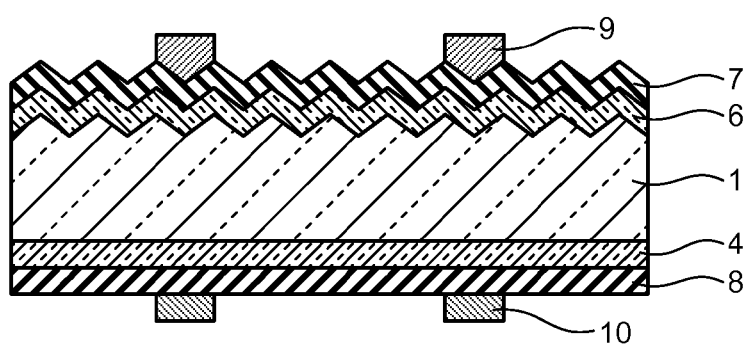

FIG. 9 is a diagram illustrating a part of a step flow of a manufacturing method of a solar cell according to a fourth embodiment of the present invention. FIGS. 10-1 to 10-8 are cross-sectional process diagrams illustrating manufacturing steps of the solar cell manufactured. The present embodiment is characterized in that one-surface mask is formed on the back surface side (S103) prior to the etching step S102 for texture formation in the first embodiment, thereby to suppress formation of textures on the back surface side. Other processes are identical to those in the first embodiment.

Due to this structure, printing of a dopant paste (DP) containing impurities is performed before texture processing and the printed DP is used as an etching protection mask, thereby fabricating a cell with only the back surface kept flat. It is sometimes more preferable that the back surface be flat from the viewpoint of passivation.

The p-type monocrystalline silicon wafer 1 is prepared as illustrated in FIG. 10-1 and the diffusion protection mask 3 is formed on one surface of the p-type monocrystalline silicon wafer 1 as illustrated in FIG. 10-2 (one surface mask formation step S103). At that time, impurities different from an impurity source at the time of diffusion are introduced to the diffusion protection mask 3. For example, an oxide film containing P or an oxide film containing B is formed. In the present embodiment, a BSG film having a thickness of about 1 micrometer is formed by the printing method. A formation method of the diffusion protection mask can be any method of the printing method, the spin coating method, the CVD method, or the sputtering method. A mask containing no impurities such as an SG film can be further formed in a stacked manner to prevent scattering of the impurities from the mask.

After formation of the diffusion protection mask 3, the p-type monocrystalline silicon wafer 1 is dipped into, for example, an etchant formed by adding an additive including a polysaccharide by about 0.1 w % to a sodium hydroxide aqueous solution of about 1 w % to perform anisotropic etching, thereby forming the uneven portion 1T on the front surface to form a textured structure as illustrated in FIG. 10-3 (texture formation step S102). At this time, because the one surface of the p-type monocrystalline silicon wafer 1 is covered with the diffusion protection mask 3, the etching progresses only on a surface exposed from the diffusion protection mask 3 and thus texture is formed only on the surface that becomes a light-receiving surface.

Subsequently, as illustrated in FIG. 10-4, diffusion layers are formed simultaneously on both surfaces of the p-type monocrystalline silicon wafer 1, respectively, by thermal diffusion processing (bifacial simultaneous diffusion step S104) similarly to the first embodiment. The n-type diffusion layer 6 is formed on the front surface side that is the light-receiving surface and the p-type diffusion layer 4 is formed on the back surface side. Also in this case, a diffusion source can be introduced by a method of bubbling a source in a liquid state to cause a gas to flow, a method of using a source in a solid state, a method of using a source in a gaseous state, and a method of spin coating a source, or the like. Furthermore, there is a possibility that diffusion optimal temperature for the light-receiving surface and that of the back surface are different from each other and thus respective suitable thermal treatment processes can be provided by appropriately setting detailed processes when performing the thermal diffusion. In this process, the doped glass 5 is formed on the front surface of the light-receiving surface side and the doped glass 5 is deposited also on the diffusion protection mask 3 on the back surface side although not illustrated in the drawings.

Also in the present embodiment, when it is assumed that required diffusion temperature is about 900° C. for the back-surface diffusion layer and 850° C. for the light-receiving-surface diffusion layer in a case where a thermal diffusion using $POCl_3$ is to be performed to the light-receiving surface, respective optimal diffusion layers can be formed by first performing high-temperature processing and then performing low-temperature processing by causing $POCl_3$ to flow, similarly to the first embodiment.

Next, the end portions are etched for junction isolation (end-face etching step S105). For example, there is a method of stacking wafers and performing plasma processing while causing a gas such as $CF_4$ to flow. There are other methods including a method of processing cell end portions with a laser after forming electrodes.

Subsequently, as illustrated in FIG. 10-5, the doped glass formed at the time of the diffusion is removed with a solution using a hydrofluoric acid (doped-glass removal step S106).

Next, the antireflection film 7 on the light-receiving surface side and the thermally-oxidized film 8 serving as a passivation film on the back surface are formed. First, as illustrated in FIG. 10-6, the antireflection film 7 such as SiN is formed on the light-receiving surface (SiN formation step S107). By performing oxidization processing in a state where SiN is formed only on the light-receiving surface, the thermally-oxidized film 8 is formed only on the back surface as illustrated in FIG. 10-7 (thermally-oxidized film formation step S108).

Finally, as illustrated in FIG. 10-8, electrodes are printed (electrode printing step S109) and are baked (baking step S110), thereby forming a solar cell.

In this manner, according to the present embodiment, a PERC type solar cell having a flat surface on the back surface and being easy to manufacture and highly efficient can be provided.

While examples where a monocrystalline silicon wafer is used have been described in the first to fourth embodiments, the wafer is not limited to the monocrystalline silicon wafer and a polycrystalline silicon wafer or a compound semiconductor wafer can be used and applied to a diffusion type solar cell.

INDUSTRIAL APPLICABILITY

As described above, the manufacturing method of a solar cell according to the present invention is useful for simplifying manufacturing process of solar cells, and is particularly suitable for manufacturing low cost and highly efficient solar cells.

REFERENCE SIGNS LIST

1 p-type monocrystalline silicon wafer, 1n n-type monocrystalline silicon wafer, 1T uneven portion, 3 diffusion protection film, 4 p-type diffusion layer, 4n n-type diffusion layer, 5 doped glass formed at time of diffusion, 6 n-type diffusion layer, 6p p-type diffusion layer, 7 antireflection film, 7s oxide film, 8 thermally-oxidized film, 8s thin oxide film, 9 light-receiving surface electrode, 10 back surface electrode.

The invention claimed is:

1. A manufacturing method of a solar cell having diffusion layers of different conductivity types respectively on a front surface of a semiconductor substrate and a back surface of the substrate, the method comprising:
    a step of forming a diffusion protection mask containing first impurities to cover one of the surfaces of the semiconductor substrate; and
    a diffusion step of
    performing a diffusion step including a thermal step of diffusing the first impurities and second impurities having a different conductivity type from that of the first impurities in a state where the one surface of the semiconductor substrate is covered with the diffusion protection mask containing the first impurities,
    forming a first-impurity diffusion layer on the one surface, and
    forming a second-impurity diffusion layer having a different conductivity type from that of the diffusion protection mask on the other surface of the semiconductor substrate.

2. The manufacturing method of a solar cell according to claim 1, wherein the step of forming the diffusion protection mask is a step of forming a film containing impurities by a printing method.

3. The manufacturing method of a solar cell according to claim 1, wherein the step of forming the diffusion protection mask is any one of a spin coating method, a CVD method, and a sputtering method.

4. The manufacturing method of a solar cell according to claim 1, wherein
    the step of forming the diffusion protection mask is a step of covering a back surface side of the semiconductor substrate with a diffusion protection mask containing first impurities, and
    the diffusion step is a step of diffusing second impurities toward a light-receiving surface side, and diffusing the first impurities toward a back surface side.

5. The manufacturing method of a solar cell according to claim 1, including a step of forming the diffusion protection mask prior to a step of forming a textured structure on the front surface of the semiconductor substrate, wherein the step of forming the textured structure is a step of forming the textured structure on the front surface other than a region in which the diffusion protection mask is formed.

6. The manufacturing method of a solar cell according to claim 1, wherein the diffusion step is a diffusion step of diffusing the second impurities using a second-impurity containing gas.

7. The manufacturing method of a solar cell according to claim 1, being a bifacial simultaneous diffusion step of simultaneously forming the first-impurity diffusion layer and the second-impurity diffusion layer.

8. The manufacturing method of a solar cell according to claim 7, including an end-face etching step of etching end portions for junction isolation after the bifacial simultaneous diffusion step.

* * * * *